(12) United States Patent
Choi

(10) Patent No.: US 6,791,897 B2
(45) Date of Patent: Sep. 14, 2004

(54) WORD LINE DRIVING CIRCUIT

(75) Inventor: Hong Sok Choi, Cheongjoo-Shi (KR)

(73) Assignee: Hynix Semiconductor Inc., Kyungki-do (KR)

(*) Notice: Subject to any disclaimer, the term of this patent is extended or adjusted under 35 U.S.C. 154(b) by 0 days.

(21) Appl. No.: 10/327,740

(22) Filed: Dec. 23, 2002

(65) Prior Publication Data
US 2004/0004899 A1 Jan. 8, 2004

(30) Foreign Application Priority Data
Jul. 5, 2002 (KR) .................. 10-2002-0038859

(51) Int. Cl.[7] .............................................. G11C 8/00
(52) U.S. Cl. .......................... 365/230.06; 365/189.11
(58) Field of Search ...................... 365/230.06, 189.11

(56) References Cited

U.S. PATENT DOCUMENTS

| 5,406,526 A | 4/1995 | Sugibayashi et al. |
| 5,864,508 A | 1/1999 | Takashima et al. |
| 6,144,610 A * | 11/2000 | Zheng et al. .......... 365/230.06 |
| 2002/0054530 A1 | 5/2002 | Chung et al. |

* cited by examiner

Primary Examiner—Thong Q. Le
(74) Attorney, Agent, or Firm—Marshall, Gerstein & Borun LLP

(57) ABSTRACT

A word line driving circuit is described herein. The word line driving circuit comprises a pull-up transistor and pull-down transistor serially connected to each other, and a control circuit configured to turn off the pull-up transistor and to turn on the pull-down transistor in response to an active command, to enable a word line driving signal to a LOW state, to turn on the pull-up transistor and to turn on the pull-down transistor for a given period of time in response to a precharge, to precharge the word line driving signal to a HIGH state, and to turn off the pull-up transistor and pull-down transistor to float the word line driving signal after the precharge command.

7 Claims, 3 Drawing Sheets

US 6,791,897 B2

WORD LINE DRIVING CIRCUIT

TECHNICAL FIELD

The present disclosure relates generally to memory devices, and more particularly, to a word line driving circuit in a memory device.

BACKGROUND

Generally, memory cells are arranged in a matrix scheme and enabled one by one with a word line signal. That is, if an active command is inputted from the outside, a word line of a corresponding address is enabled. To enable the word line, a hierarchical driving method is usually used. In the memory cell array as shown in FIG. 1, for example, a word line driving circuit decodes 64 main word line driving signals (HBMWB<0:63>) and 8 driving signals (HAMWB<0:7>) to enable one of 512 word lines.

The main word line driving circuit shown in FIG. 2 includes three NMOS transistors MN1, MN2 and MN3 serially connected to two PMOS transistors MP1 and MP2, and two inverters IV1 and IV2. A circuit for controlling the main word line driving circuit is shown in FIG. 3. The operation of the conventional main word line driving circuit is described below with reference to FIGS. 3 and 4.

When an active command is inputted, an output signal (MWPREB) of an AND gate A1 shown in FIG. 3 becomes a HIGH state and precharge is released if inactive signals (INACTV1 and INACTV2) becomes a HIGH state and a block select signal (BLKSEL) becomes a HIGH state. Also, when each of a signal (X345<0:7>) resulting from an address (A3, 4, 5) being decoded, a signal (X678<0:7>) resulting from an address (A6, 7, 8) being decoded, and a signal (X9101112) resulting from an address (A9, 10, 11, 12) being decoded is at a HIGH state, a PMOS transistor MP1 shown in FIG. 2 is turned off and NMOS transistors MN1, MN2, MN3 are turned on. Therefore, the main word line driving signal (HBMWB) being an output of the inverter (IV2) is enabled to a LOW state. Next, when a precharge command is inputted, the main word line driving signal (HBMWB) is precharged with a HIGH state if each of the decoded signals (X345, X678, X9101112) is disabled to a LOW state and the output signal (MWPREB) becomes a LOW state. Thereafter, the main word line driving signal (WL) maintains the HIGH state with it being precharged.

Referring to FIG. 5, if the power supply line are positioned between the lines for the main word line driving signal, the operating speed of the memory is improved because drop in the voltage is reduced by the power supply line. In a common DRAM, a characteristic of tRCD can be improved by about two nanoseconds.

However, if there is resistive connection between the lines for the main word line driving signal and the power supply line because of problems in the process, a VPP level being an internally generated power is lowered by the resistive connection between VPP being a voltage level of HBMWB<1> at a precharge state and the power supply line VDD even though a corresponding word line driving signal is substituted by a redundancy main word line driving signal (RHBMWB<0>) as indicated by "A" in FIG. 5. Generally, VPP has a value of 4V and VDD has a value of 3V. In this case, a VPP level sensor and a pump circuit are driven to raise the level of the lowered VPP power supply. A problem occurs when the yield of the memory is significantly lowered because there is a lot of current flow at the precharge state.

SUMMARY OF THE DISCLOSURE

The present disclosure provides a main word line driving circuit capable of suppressing an increase in current flow at a precharge state in such a way that a main word line driving signal is substituted by a redundancy main word line driving signal and a corresponding main word line driving signal is floated when a line for a main word line driving signal and a neighboring power supply line are connected.

The word line driving circuit includes a main word line driving circuit configured to generate a word line driving signal, pull-up and pull-down transistors serially connected to each other, and a control circuit configured to generate a control signal to control the word line driving signal, to turn off the pull-up transistor and to turn on the pull-down transistor in response to an active, to enable the word line driving signal to a LOW state, to turn on the pull-up transistor and to turn on the pull-down transistor for a given period of time in response to a precharge command, to precharge the word line driving signal to a HIGH state, and to turn off the pull-up transistor and the pull-down transistor to float the word line driving signal after the precharge command.

Further, the word line driving circuit comprises a control circuit configured to output a driving signal, a main word line precharge control signal, a block select signal, and first, second and third control signals; a delay circuit configured to delay the block select signal; a first PMOS transistor connected between the power supply and a first node; a first NMOS transistor responsive to the main word line precharge control signal; first, second and third NMOS transistors serially connected to each other between the first node and the ground, and responsive to the first, second and third control signals, respectively; a pull-up transistor connected between the power supply and an output node; a pull-down transistor connected between the output node and the ground; an inverter connected between a gate terminal of the pull-down transistor and the first node; a second PMOS transistor connected in parallel to the first PMOS transistor, wherein a gate terminal of the second PMOS transistor is connected to a gate terminal of the pull-down transistor; and a NAND gate configured to logically combine an output signal of the delay circuit and the potential of the first node to provide the logically combined signal to a gate terminal of the pull-up transistor.

BRIEF DESCRIPTION OF THE DRAWINGS

This disclosure will be described in terms of several embodiments to illustrate its broad teachings. Reference is also made to the attached drawings.

DETAILED DESCRIPTION

The present disclosure will be described in detail by way of a preferred embodiment with reference to accompanying drawings.

Figure 1:
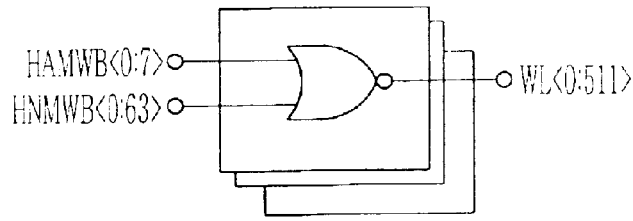
FIG. 1 is a block diagram of a conventional word line driving circuit.
Figure 2:
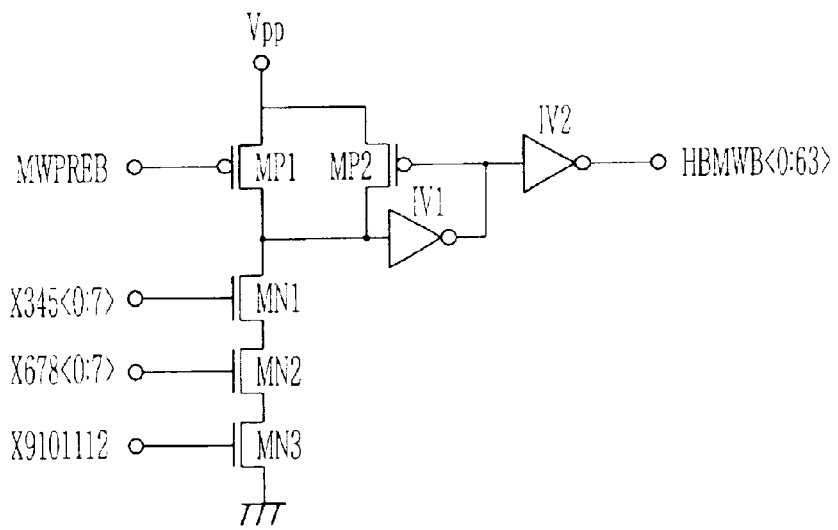
FIG. 2 shows a conventional main word line driving circuit.
Figure 3:
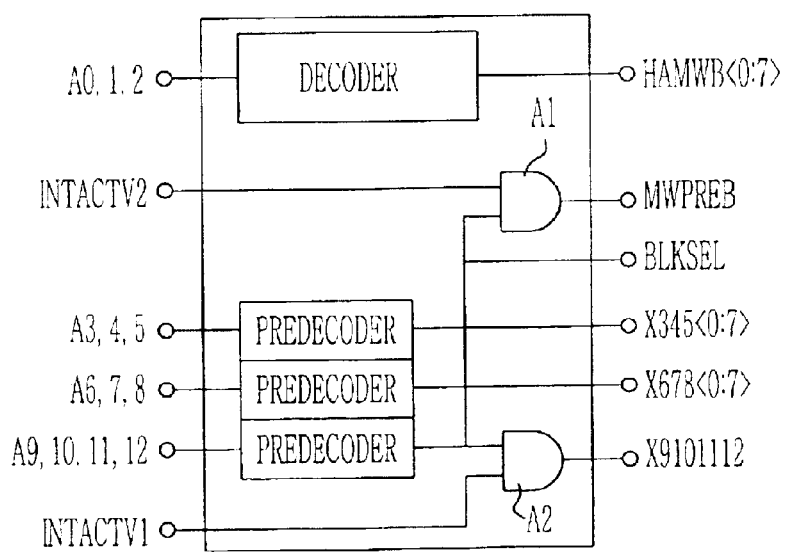
FIG. 3 shows a control circuit configured to control the main word line driving circuit in FIG. 2.
Figure 4:
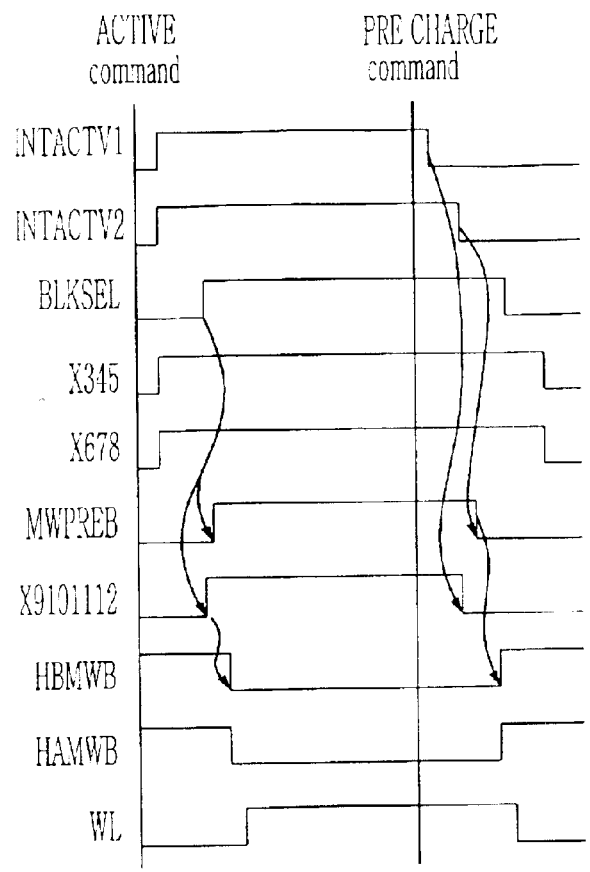
FIG. 4 is a waveform illustrating the operations of the main word line driving circuit and the control circuit shown in FIGS. 2 and 3, respectively.
Figure 5:
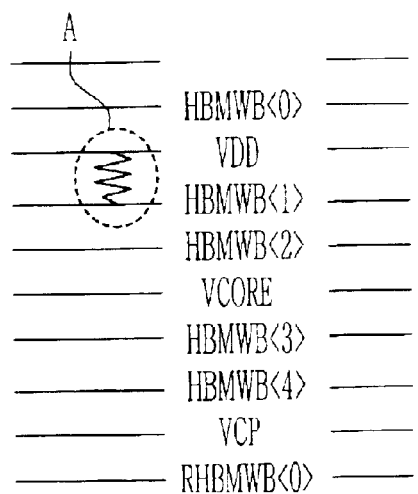
FIG. 5 shows a wiring in the common memory array.
Figure 6:
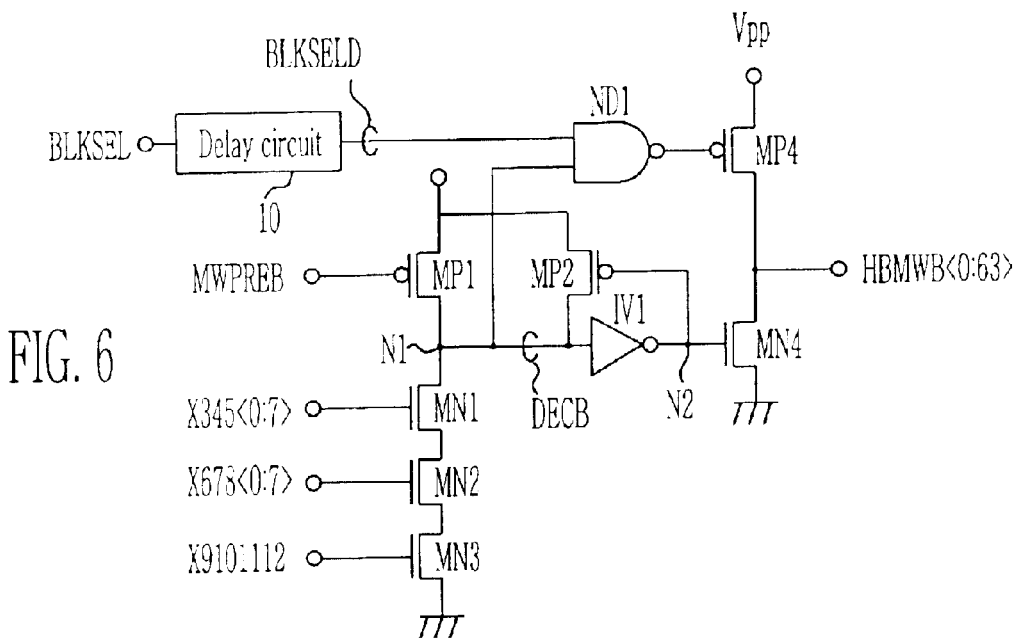
FIG. 6 shows a main word line driving circuit.

Referring to FIG. 6, a main word line driving circuit is described. A block select signal (BLKSEL) is inputted to a delay circuit 10. The delay circuit 10 then delays the inputted block select signal (BLKSEL) for a given time to produce a delayed signal (BLKSELD). The delayed signal (BLKSELD) is then inputted to one input terminal of a NAND gate ND1. A main word line precharge control signal (MWPREB) generated by the control circuit such as one shown in FIG. 3 is inputted to a gate terminal of a PMOS transistor MP1 connected between the power supply terminal and a node N1. NMOS transistors MN1, MN2 and MN3 are serially connected between the node N1 and the ground. Control signals (X345<0:7>, X678<0:7>, X9101112) generated by the control circuit such as one shown in FIG. 3 are inputted to the gate terminals of the NMOS transistors MN1, MN2 and MN3, respectively. A PMOS transistor MP2 is connected in parallel to the PMOS transistor MP1, and an inverter IV1 is connected between the node N1 and a node N2. A gate terminal of the PMOS transistor MP2 is connected to the node N2, and the node N1 is connected to the other input terminal of the NAND gate ND1.

Further, a PMOS transistor MP4 and a NMOS transistor MN4 are serially connected between the power supply terminal and the ground. A gate terminal of the PMOS transistor MP4 for pull-up is connected to an output terminal of the NAND gate ND1. A gate terminal of the NMOS transistor MN4 for pull-down is connected to the node N2.

Figure 7:
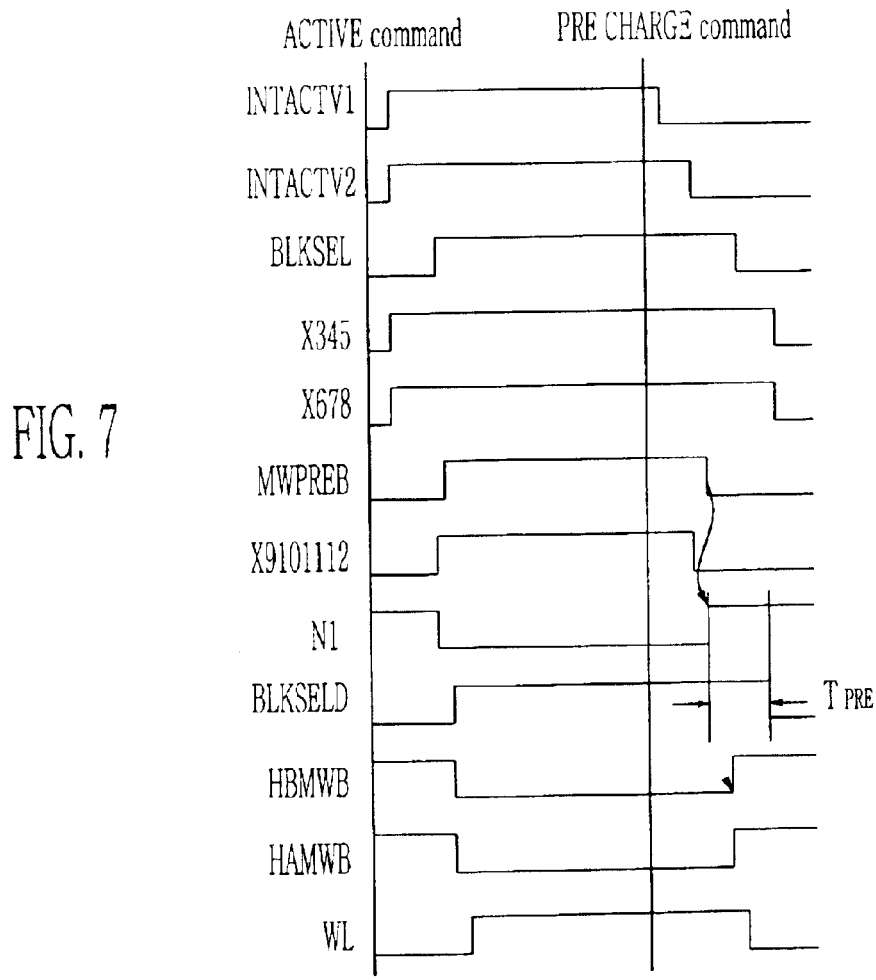
FIG. 7 is a waveform illustrating the operation of the main word line driving circuit shown in FIG. 6.

The operation of the main word line driving circuit is described with reference to FIGS. 3 and 7. When an active command is inputted, if each of the control signal (MWPREB) and the control signals (X345<0:7>, X678<0:7>, X9101112) is at a HIGH state, the gate voltage of the PMOS transistor MP4 becomes a HIGH state and the gate voltage of the NMOS transistor MN4 also becomes a HIGH state. The word line driving signal (HBMWB<0:6>) is thus enabled to a LOW state.

If a precharge command is inputted as the gate voltage of the NMOS transistor MN4 becomes a LOW state for a given period time ($T_{PRE}$) and the gate voltage of the PMOS transistor MP4 becomes a LOW state, the word line driving signal (HBMWB) becomes a HIGH state. A corresponding word line is thus reset to a LOW state.

In the conventional circuit, the word line driving signal (HBMWB) is kept at a HIGH state even after the $T_{PRE}$ time. Here, however, the gate voltage of the NMOS transistor MN4 becomes a LOW state and the gate voltage of the PMOS transistor MP4 becomes a HIGH state after the $T_{PRE}$ time. Thus, the word line driving signal (HBMWB) is floated. As the driving signal (HAMWB) is kept at a HIGH state and the word line driving signal (HBMWB) is floated, the word line is kept at a LOW state.

In case of the driving signal (HAMWB), there is no neighboring power supply line and the number of the signal lines is small. Thus, there is a problem of resistive connection as in the main word line driving signal (HBMWB).

There are various methods for initializing the word line driving signal (HBMWB) to a HIGH state. One method is when an automatic refresh operation occurs before normal read/write operation is performed for the memory, an internal precharge command is generated for a given period of time to initialize the word line driving signal (HBMWB) so that it has a HIGH state after the word line driving signal (HBMWB) is enabled to a LOW state. Also, another method is when application of the external power of DRAM is detected and the block select signal becomes a HIGH state to initialize the word line driving signal (HBMWB) during the time when a signal of a pulse state is generated.

As mentioned above, the word line driving signal (HBMWB) is floated after it is being floated. Therefore, the word line driving circuit may suppress generation of the leakage current even if there is resistive connection between a line for a word line driving signal and a neighboring line because they are shorted.

Many changes and modifications to the embodiments described herein could be made. The scope of some changes is discussed above. The scope of others will become apparent from the appended claims.

What is claimed is:

1. A word line driving circuit comprising:

a main word line driving circuit configured to output a word line driving signal into an output node; and a control circuit configured to generate control signals to control the main word line driving circuit, the main word line driving circuit comprising:

a PMOS transistor connected between the power supply and a node, wherein the PMOS transistor is responsive to an output control signal of the control circuit, a plurality of NMOS transistors serially connected to each other between the node and the ground, wherein the NMOS transistors are responsive to output control signals of the control circuit, respectively, a pull-up transistor connected between the power supply and the output node, a pull-down transistor connected between the output node and the around, an inverter connected between a gate terminal of the pull-down transistor and the node, and a logically combined means configured to logically combine an output control signal of the control circuit and the potential of the node to supply the logically combined signal to a gate terminal of the pull-up transistor, wherein the main word line driving circuit configured to control the word line driving signal, to turn off the pull-up transistor and to turn on the pull-down transistor in response to an active command, to enable the word line driving signal to a LOW state, to turn on the pull-up transistor and to turn off the pull-down transistor for a given period of time in response to a precharge command, to precharge the word line driving signal to a HIGH state, and to turn off the pull-up transistor and the pull-down transistor to float the output node after the precharge command.

2. The word line driving circuit as claimed in claim 1, wherein the pull-up transistor comprises a PMOS transistor, and wherein the pull-down transistor comprises a NMOS transistor.

3. A word line driving circuit comprising:

a control circuit configured to output a driving signal, a main word line precharge control signal, a block select signal, and first, second and third control signals;

a delay circuit configured to delay the block select signal;

a first PMOS transistor connected between the power supply and a first node, wherein the first PMOS transistor is responsive to the main word line precharge control signal;

first, second and third NMOS transistors serially connected to each other between the first node and the ground, wherein the first, second and third NMOS transistors are responsive to the first, second and third control signals, respectively;

a pull-up transistor connected between the power supply and an output node;

a pull-down transistor connected between the output node and the ground;

an inverter connected between a gate terminal of the pull-down transistor and the first node;

a second PMOS transistor connected in parallel to the first PMOS transistor, wherein a gate terminal of the second PMOS transistor is connected to a gate terminal of the pull-down transistor; and a NAND gate configured to logically combine an output signal of the delay circuit and the potential of the first node to supply the logically combined signal to a gate terminal of the pull-up transistor.

4. The word line driving circuit as claimed in claim 1, wherein the logically combined means comprises a NAND gate.

5. The word line driving circuit as claimed in claim 1, wherein the NMOS transistors comprise first, second and third NMOS transistors.

6. The word line driving circuit as claimed in claim 1, wherein the main word line driving circuit further comprises a second PMOS transistor connected between the power supply and the node, wherein a gate terminal of the second PMOS transistor is connected to a gate terminal of the pull-down transistor.

7. The word line driving circuit as claimed in claim 3, wherein the pull-up transistor comprises a PMOS transistor, and wherein the pull-down transistor comprises a NMOS transistor.

* * * * *

UNITED STATES PATENT AND TRADEMARK OFFICE
CERTIFICATE OF CORRECTION

PATENT NO. : 6,791,897 B2
DATED : September 14, 2004
INVENTOR(S) : Hong S. Choi

It is certified that error appears in the above-identified patent and that said Letters Patent is hereby corrected as shown below:

<u>Column 4,</u>
Line 32, after "and the," please delete "around" and insert -- ground -- in its place.

Signed and Sealed this

Twenty-second Day of February, 2005

JON W. DUDAS
*Director of the United States Patent and Trademark Office*